United States Patent [19]

Miller

[11] Patent Number: 4,822,196
[45] Date of Patent: Apr. 18, 1989

[54] BINDING POST REPAIR KIT

[76] Inventor: Douglas J. Miller, 1319 Pulaski St., Riverhead, N.Y. 11901

[21] Appl. No.: 218,083

[22] Filed: Jul. 12, 1988

Related U.S. Application Data

[62] Division of Ser. No. 53,099, May 22, 1987.

[51] Int. Cl.$^4$ ............................................. F16D 1/00
[52] U.S. Cl. ....................................... 403/11; 403/262
[58] Field of Search .................... 24/457, 525, 569;
29/402.08, 402.19, 426.1, 446, 526.1; 403/11, 186, 258, 261, 262

[56] References Cited

U.S. PATENT DOCUMENTS

| | | | |
|---|---|---|---|
| 238,847 | 3/1881 | Backland | 24/569 X |
| 801,102 | 10/1905 | Quay | 24/569 X |
| 2,219,545 | 10/1939 | Gordon et al. | 24/569 X |
| 2,506,615 | 5/1950 | Rosen | 403/186 X |

FOREIGN PATENT DOCUMENTS 130818  3/1929  Switzerland ........................ 24/569

*Primary Examiner*—P. W. Echols
*Assistant Examiner*—Andrew E. Rawlins
*Attorney, Agent, or Firm*—Bauer & Schaffer

[57] ABSTRACT

A damaged binding post on a telephone wire connecting panel is replaced by a binding post having a threaded stem and a polygonal head adapted to seat freely in a hole in the panel. A retaining nut is screwed on the stem and spaced from the surface of the panel. A bridge is placed over the binding post and each of the next adjacent binding posts and a locking nut is threaded over each of the stems of the adjacent binding posts, to cause the bridge to bow and provide a bias urging the retaining nut downwardly forcing the replacement post to seat in the hole.

5 Claims, 1 Drawing Sheet

BINDING POST REPAIR KIT

RELATED APPLICATION

This is a division of copending application Ser. No. 053,099, filed May 22, 1987.

BACKGROUND OF THE INVENTION

The present invention relates to a method and apparatus for repairing and/or replacing individual binding posts on a telephone wire connecting panel.

The purpose of the present invention may be easily seen by reference to the accompanying FIGS. 1 and 2, which illustrate the conventional mounting panel system as used in large telephone switching operations. The panel, generally depicted by the numeral 10 comprises a mounting board 12 of non-conductive or dielectric material such as Bakelite, phenolic, or resinous plastic. A plurality of binding posts 14, are mounted on the face of the board 12, in parallel sets 16, generally three binding posts to a set. As seen in FIG. 2, each binding post 14 comprises a threaded screw 18 having a square head 20 which is inserted in a correspondingly shaped hole 22 to be molded monolithically and integrally with the board 12. Once in place, the threaded screw is provided with a nut 24 to hold the telephone wire or wires 26.

Because the square heads 20 of the binding posts are molded in situ within the mounting board, the binding posts 14 are prevented from relative movement and are held in their given fixed spaced array. The square heads 20 of the posts lock in the mounting board 12 and thus resist torsional rotative forces applied to the thread of the screw 18 during the application of the nut 24 binding the telephone wires 26 to the screw.

However, it frequently happens that the screws 18 of the binding posts 14 will break along their threaded lengths, during the application of the locking nuts 24 or wire 26 to the post. When this occurs, the binding post is no longer useable. It also sometimes happens that the application of excessive turning or torsional force to the thread of the screw 18, will cause the post 14 to loosen in its mounting in the board forming an enlarged hole 22 as for example, in the central post 14 shown in FIG. 2. This leaves a space 28 allowing the central post 14 to fall freely out of the board resulting in the absence of a connection site for a telephone wire.

It is uneconomical to replace the entire connecting board merely for the sake of one of even a few faulty or broken binding posts. The boards themselves are extremely costly and the labor required for exchanging each and every wire connection, makes such replacement extremely prohibitive. On the other hand, simple replacement of the individual binding posts under known techniques is also not feasible since the binding posts cannot be simply glued or adhered to the board or remolded, as such processes might cause damage, not only to the post being repaired, but to adjacent posts as well.

It is therefore the object of the present invention to provide an inexpensive and simple method and apparatus for repairing in situ, and/or replacing, in situ, damaged binding posts, which overcome the disadvantages of the prior art.

It is an object of the present invention to provide a replacement binding post structure by which a new binding post can be added to the mounting board in place of the broken or missing binding post.

The foregoing objects, together with other objects and advantages will be apparent from the following disclosure.

SUMMARY OF THE INVENTION

According to the present invention, a method and apparatus for repairing and/or replacing damaged binding posts is provided. Initially, the damaged binding post is removed from the mounting board and the hole in which it had been set is left vacant. A new or rebuilt binding post, having a correspondingly formed polygonal head is then fit into the vacant hole. A locking nut is screwed over the steps of the replacement binding post so that it remains raised, approximately 1/64th of an inch, above the face of the mounting board. That is, the replacement binding post is loosely placed into the mounting board so that its polygonal head rests in the bottom of the hole leaving space between the face of the connecting board and the locking nut anywhere between 0.030 inches and 0.15 inches, a space not provided in the companion posts, which remain integrally molded.

Thereafter, a rigid bridging plate, formed as a strip of insulating or dielectric material having a linear array of holes arranged to conform to the array of holes in the set of binding posts containing the replacement post, is placed with its central hole over the replacement binding post and its laterally spaced holes over the adjacent binding post in the set.

Finally, locking nuts are screwed on to stems of each post above the bridging plate and all these upper locking nuts are tightened into place. Since the first locking nut on the replacement binding post is raised above the level of the face of the mounting board by at least the 1/64th of an inch spacing, this nut is raised above the level of the similar mounting nuts of the adjacent binding posts of the array, consequently, the mounting bridge is caused to bow and slightly flex at its center, upwardly and away from the mounting board. This bowing causes the mounting bridge to apply a downward force against the locking nut of the replacement binding post, causing the replacement binding post to fit snuggly in its mounting hole in the mounting board.

In the foregoing manner, any one of the binding posts in a given array, can be easily repaired and/or replaced. Since the replacement binding post is held by at least two other non-defective binding posts, the replacement binding posts will be held secure and rigidly in place for the initially intended purpose.

Full details in the present invention, are set forth in the following description and are illustrated in the accompanying drawings.

DESCRIPTION OF THE INVENTION

Figure 1:
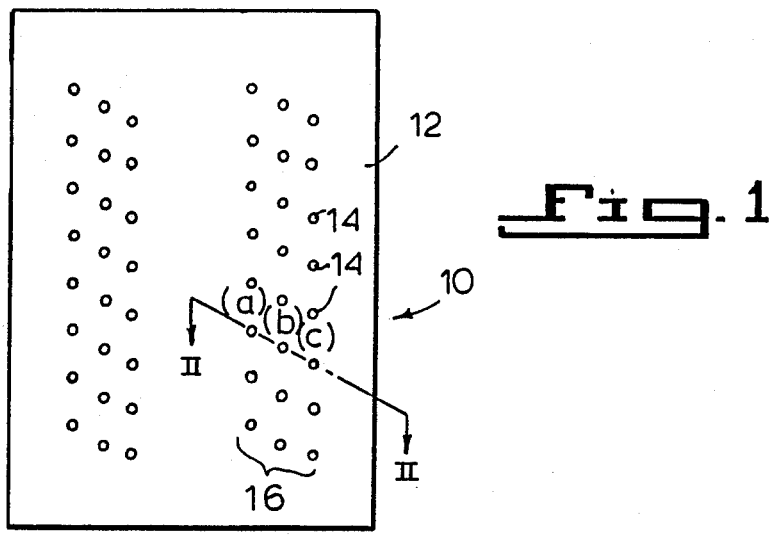
FIG. 1 is a schematic plan view of a conventional connecting panel.
Figure 2:
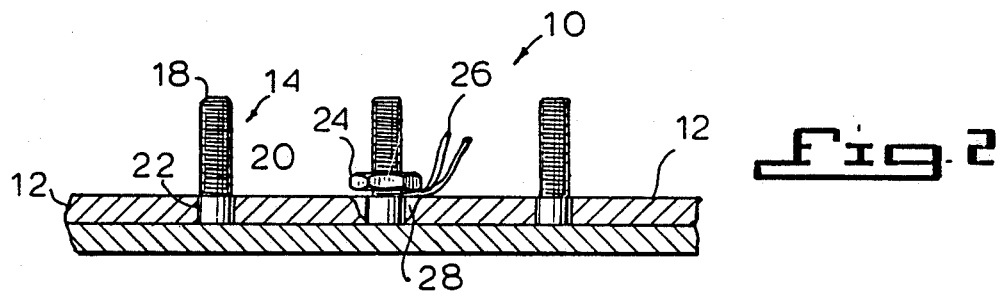
FIG. 2 is a side elevational side view partially sectioned of an array of binding posts on the panel shown in FIG. 1.
Figure 3:
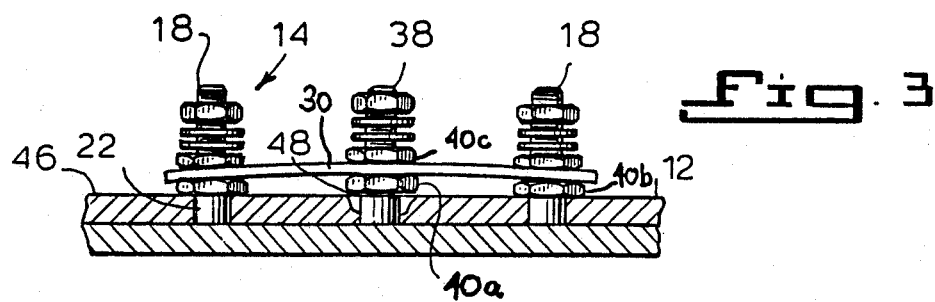
FIG. 3 is a view similar to that of FIG. 2 showing the replacement of a defective binding post in accordance with the present invention.
Figure 4:
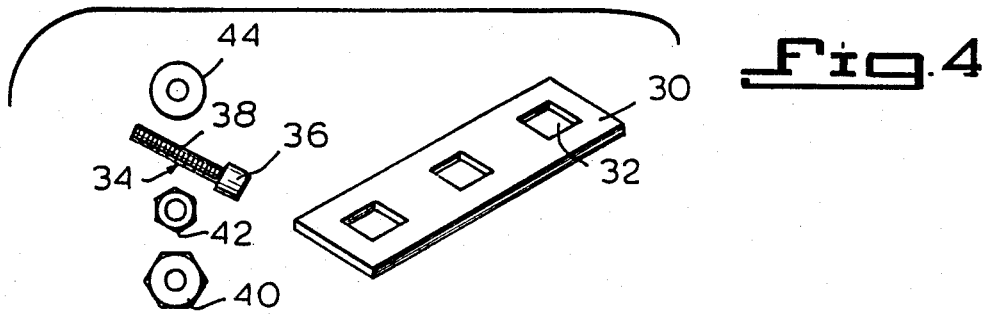
FIG. 4 is an exploded perspective view of the elemental parts of the present invention.

The present invention is intended to be applied to the type of mounting panel 10, shown in FIGS. 1 and 2 without modification or change to the mounting board 12 or the binding posts 14, initially employed and thus the same numerals are used to denote corresponding parts, in illustrating the present invention in FIGS. 3 and 4.

As seen in FIG. 4, the replacement and/or repair elements includes a bridge plate 30, of rectangular shape, having a plurality of holes 32, shown here as being square, although other polygonal shapes may be used. The bridge plate 30, is a strip of rigid non-conductive or dielectric material having an overall size sufficient to fit over a given set or aray 16 of posts 14, the holes 32 being also sufficiently large enough to freely pass over the binding posts 14. The replacement and/or repair elements, may include a replacement post 34 having a polygonal head 36, the post 34 being preferably formed of cadmium plated brass and being provided with a threaded stem 38. Finally the replacement and/or repair elements may include several large nuts 40, a smaller nut 42 and several washers 44, preferably, although not necessarily, formed of brass. The number of each of the elements depends on the number of posts in the set or array in which the replacement post is to be included. For the sake of simplicity of disclosure, the parts shown in FIG. 4 are required for a single replacement in a three hole set, assuming all parts are in fact used or no similar parts remain from the original set. These parts may be augmented with other parts or diminished as deemed necessary by the user.

Turning to FIG. 3, it will be first assumed that the damaged central binding post 14 shown in FIG. 2, is no longer usable and has been removed and replaced with replacement binding post 34, which has its polygonal head 36 set within the vacant hole 28, the damaged post 14 being discarded, although frequently it may be rebuilt and used as the replacement post. If necessary, the hole 28 has been cleaned and enlarged so that the head 36 rests on the bottom of the hole 28. A large primary retaining nut 40 40(a) is screwed over the stem 38 of the replacement post 34 until it is spaced from the face 46 of the mounting board 12 by approximately 1/64 of an inch leaving, purposefully, a gap 48 of between 0.030 to 0.15 inches. At the same time, a similarly large secondary locking nut 40 may be screwed over each of these threaded stems 18 of the still usable and remaining original posts 14 to the left and right in the set 16, until these nuts are tightened against the surface 46 of the connecting board 12. The use of matching nuts 40(b) on the non-damaged binding posts 14, is optional and can be often omitted.

In any event the primary retaining nut 40(a), placed over the replacement post 34, is raised slightly above the surface 46 so as to use above the level of the secondary locking nuts 40(b) on the next adjacent posts 14. Therefafter, the bridge plate 30 is placed over all the posts 14 in in the set, as well as the centrally located replacement post 34 and secured into place by a set of large locking nuts 40(c) placed above the bridging plate 30 and which are screwed as tightly as possible on the stems 18 and 38 respectively.

As a consequence of the fact that the lower primary retaining nut 40(a) on the replacement post 34 is raised above the adjacent corresponding secondary nuts 40 on the adjacent posts 14, the tightening of the upper large nuts 40(c) will cause the rigid bridge plate 30 to bow or bend downwardly at its ends. This will create a strong downward force on the raised primary nut 40(a) below the bridge 30 forcing the replacemeent post 34 in the downward direction and effectively locking the head 36 in the hole 28. It is essential, however, that the primary retaining nut 40(a) be initially raised above the surface 46 of the mounting board 12 sufficient to allow the replacement post 34 to be moved fully into the hole 48.

As a result, the replacement post will be firmly locked into place. By raising the lower nut upwardly from the mounting board, the bridge plate is caused to bow upwardly away from the mounting board. The upward bowing of the mounting bridge and its support at its opposite ends by the adjacent mounting posts, caused the bridge plate to be sprung, as if constituting a spring thereby applying a downward force on and against the lower primary nut of the replacement binding post, to cause the replacement binding post to set snugly in its mounting hole in the mounting board. Thus, the downward compressive force applied by the bridge plate retains the replacement binding post in position within the mounting board and in the square hole previously vacated by the damaged binding post to retain the new binding post in position on the mounting board with the same rigidity and securely as the original binding post had when it was molded integral with and as a monolithic unitary part of the mounting board.

Finally , a pair of washers 44 and a small nut 42 is placed above the locking nuts 40(c), so that the telephone wires can be received and held in place firmly, independently of the locking nuts 40.

It will be appreciated from the foregoing, that the present invention provides a simple method and apparatus for repairing faulty wire connecting panels and replacing broken binding posts. The method and means for carrying out the method are extremely inexpensive, small, lightweight and can be easily carried by the service personnel in his pockets, tool boxes and the like. The system requires replacement of only the most damaged post and makes use of only a few adjacent binding posts, at virtually no cost.

A number of changes and modifications have been discussed herein. Other modifications will be obvious to those skilled in this art. Accordinly, it is intended that the foregoing disclosure be taken as illustrative only and not limiting of the scope of the invention.

I claim:

1. Apparatus for repairing damaged binding posts in a telephone wire connecting panel having a mounting board in which a plurality of spatially aligned binding posts are normally integrally imbedded and wherein said damaged binding post is removed therefrom, comprising a replacement binding post loosely held in a hole in said mounting panel in lieu of said damaged binding post, a bridging plate having a plurality of holes therein, each hole adapted to receive therethrough a binding post, said bridging plate being located over the replacement binding post and at least each one of the next adjacent binding posts in the array, at least one retaining spacer applied over the replacement binding post beneath said bridge plate and above said mounting panel, said at least one spacer having a cumulative height sufficient to raise said bridging plate above said mounting panel, and a locking nut applied to at least each of the next adjacent binding posts in the array above said bridging plate, said fastening nuts acting to flex said plate to apply a downward holding bias on the retaining nut on the replacement binding post.

2. The apparatus according to claim 1 including a replacement binding post having a threaded stem and a polygonal head, said head being adapted to seat loosely in a hole formed in said mounting panel at the position of the faulty binding post in the array, and said at least one spaced being a nut threaded on said replacement binding post.

3. The apparatus according to claim 1 wherein said bridging plate comprises a substantially rigid metal strip flexible under pressure.

4. The apparatus according to claim 3 wherein said holes in said bridging plate are polygonal.

5. The apparatus according to claim 1 wherein said retaining nut is spaced at least 1/64 of an inch from the surface of the mounting board.

* * * * *